(12) United States Patent
Liu

(10) Patent No.: US 11,566,628 B1
(45) Date of Patent: Jan. 31, 2023

(54) HANDHELD FAN

(71) Applicant: Lifang Liu, Shenzhen (CN)

(72) Inventor: Lifang Liu, Shenzhen (CN)

( * ) Notice: Subject to any disclaimer, the term of this patent is extended or adjusted under 35 U.S.C. 154(b) by 0 days.

(21) Appl. No.: 17/588,217

(22) Filed: Jan. 29, 2022

(51) Int. Cl.
*F04D 25/08* (2006.01)
*F04D 29/58* (2006.01)
*F04D 19/00* (2006.01)
*H01L 35/28* (2006.01)

(52) U.S. Cl.
CPC ......... *F04D 25/084* (2013.01); *F04D 19/002* (2013.01); *F04D 29/5853* (2013.01); *H01L 35/28* (2013.01)

(58) Field of Classification Search
CPC .. F04D 25/084; F04D 19/002; F04D 29/5853; H01L 35/28
See application file for complete search history.

(56) References Cited

U.S. PATENT DOCUMENTS

| | | | |
|---|---|---|---|
| 4,551,857 A * | 11/1985 | Galvin | A42C 5/04 2/181.2 |
| 6,125,636 A * | 10/2000 | Taylor | H01L 35/00 62/3.5 |
| 10,709,601 B2 * | 7/2020 | Adair | A61F 7/02 |
| 2006/0101556 A1 * | 5/2006 | Goldsborough | A42B 3/285 2/424 |
| 2007/0137685 A1 * | 6/2007 | Jwo | H01L 35/00 136/203 |
| 2008/0141681 A1 * | 6/2008 | Arnold | F25B 21/04 62/3.5 |
| 2017/0035602 A1 * | 2/2017 | Shapiro | A61F 7/007 |
| 2019/0162460 A1 * | 5/2019 | Oh | F25D 11/003 |
| 2021/0355960 A1 * | 11/2021 | Liu | F04D 25/084 |
| 2021/0368872 A1 * | 12/2021 | Lee | F04D 25/084 |
| 2022/0106963 A1 * | 4/2022 | Li | F04D 25/084 |
| 2022/0145896 A1 * | 5/2022 | Li | A61F 7/00 |

* cited by examiner

Primary Examiner — Aaron R Eastman

(57) ABSTRACT

A handheld fan includes a housing, a fan assembly mounted in the housing and close to a rear portion of the housing, a semiconductor chilling plate mounted in the housing and arranged in front of the fan assembly, and a cold conducting piece arranged on a front end of the housing. A front end surface of the semiconductor chilling plate is a cooling surface. The cold conducting piece is attached to the front end surface of the semiconductor chilling plate. An air outlet is defined between the cold conducting piece and the housing.

11 Claims, 3 Drawing Sheets

HANDHELD FAN

TECHNICAL FIELD

The present disclosure relates to a field of fan technology, and in particular to a handheld fan.

BACKGROUND

In summer, people often use handheld fans to cool down. However, a conventional handheld fan has an unsatisfactory cooling effect on the human body due to its small size and low air volume.

SUMMARY

The present disclosure aims to solve the above-mentioned technical problems in the prior art at least to a certain extent. Therefore, the present disclosure provides a handheld fan, which is able to effectively ventilate the air and cool a body temperature.

To achieve the above object, the present disclosure provides a handheld fan. The handheld fan comprises a housing, a fan assembly mounted in the housing and close to a rear portion of the housing, a semiconductor chilling plate mounted in the housing and arranged in front of the fan assembly, and a cold conducting piece arranged on a front end of the housing. A front end surface of the semiconductor chilling plate is a cooling surface. The cold conducting piece is attached to the front end surface of the semiconductor chilling plate. An air outlet is defined between the cold conducting piece and the housing.

When in use, a user is able to directly attach a front end surface of the cold conducting piece to the skin, and cooperate with airflow generated by the fan assembly to perform direct double cooling on a human body to obtain a good cooling effect.

In some embodiments of the present disclosure, the cold conducting piece comprises a metal temperature-conducting cover and a metal temperature-conducting block. A rear end surface of the metal temperature-conducting block is attached to the cooling surface of the semiconductor chilling plate. An area of the rear end surface of the metal temperature-conducting block is greater than an area of the front end surface of the semiconductor chilling plate. The metal temperature-conducting cover is covered on a front end surface of the metal temperature-conducting block.

In some embodiments of the present disclosure, the front end surface of the metal temperature-conducting cover is an arc surface protruding forward.

In some embodiments of the present disclosure, the handheld fan further comprises a heat dissipating net. The heat dissipating net is arranged between the semiconductor chilling plate and the fan assembly. The heat dissipating net is attached to a rear end surface of the semiconductor chilling plate.

In some embodiments of the present disclosure, the heat dissipating net is arranged behind the air outlet.

In some embodiments of the present disclosure, an air duct is arranged on a front portion in the housing. A shape of an outer contour of the air duct is matched with a shape of an inner wall of the housing. A mounting portion is arranged in a middle portion of the air duct; the mounting portion is hollow. A front portion of the mounting portion is configured to fix the semiconductor chilling plate and the cold conducting piece. A gap is defined between the mounting portion and a side wall of the air duct to form the air outlet.

In some embodiments of the present disclosure, the mounting portion is in the shape of a bowl with a first opening and a second opening separately on two ends of the mounting portion. The first opening is greater than the second opening. The first opening faces forward.

In some embodiments of the present disclosure, the housing comprises a front shell and a rear shell. The fan assembly, the semiconductor chilling plate, and the cold conducting piece are fixed on the rear shell.

Additional aspects and advantages of the present disclosure will be presented in part in the following description, and part of the additional aspects and advantages of the present disclosure will become apparent from the following description, or may be learned by practice.

BRIEF DESCRIPTION OF DRAWINGS

The above additional aspects and/or advantages of the present disclosure will become apparent and readily understood from the following description of embodiments in conjunction with the accompanying drawings.

Figure 1:
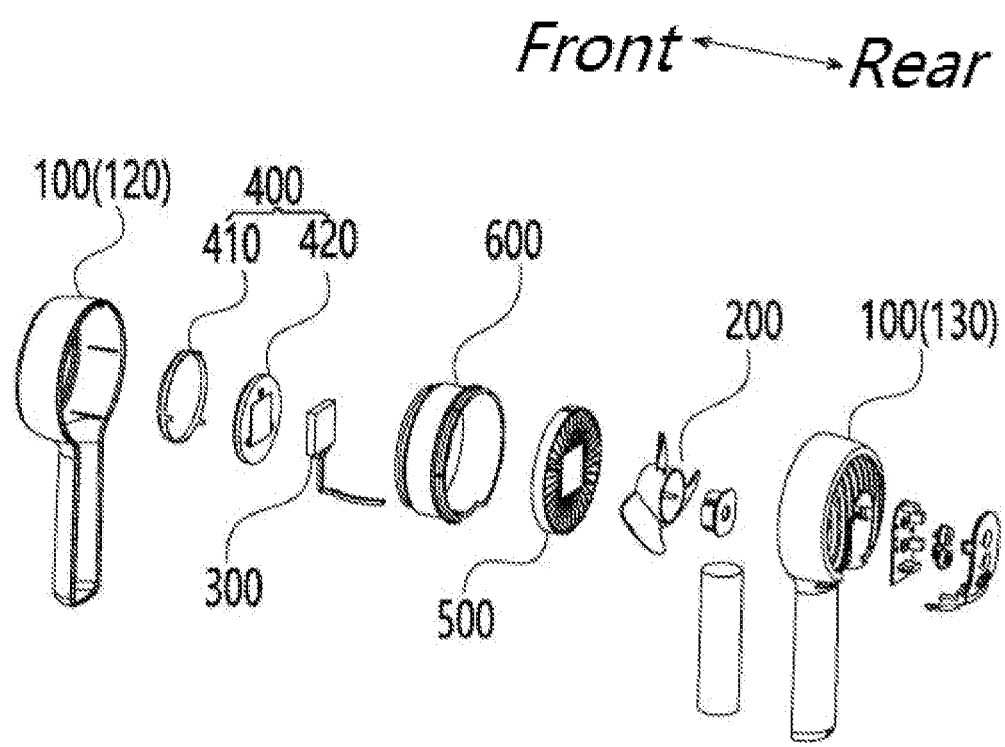
FIG. 1 is an exploded schematic diagram of a handheld fan according to one embodiment of the present disclosure.

In the drawings:
housing—100; fan assembly—200; semiconductor chilling plate—300; cold conducting piece—400; air outlet—110; metal temperature-conducting cover 410; metal temperature-conducting block—420; heat dissipating net—500; air duct—600; mounting portion—610; front shell—120; rear shell—30.

DETAILED DESCRIPTION

Embodiments of the present disclosure will be described in detail below. Examples of such embodiments are shown in the accompanying drawings. Throughout the drawings, same or similar reference numbers refer to the same or similar elements or elements having the same or similar functions. The embodiments described below with reference to the accompanying drawings are exemplary, and are intended to explain the present disclosure, and should not be understood as limitations of the present disclosure.

Figure 2:
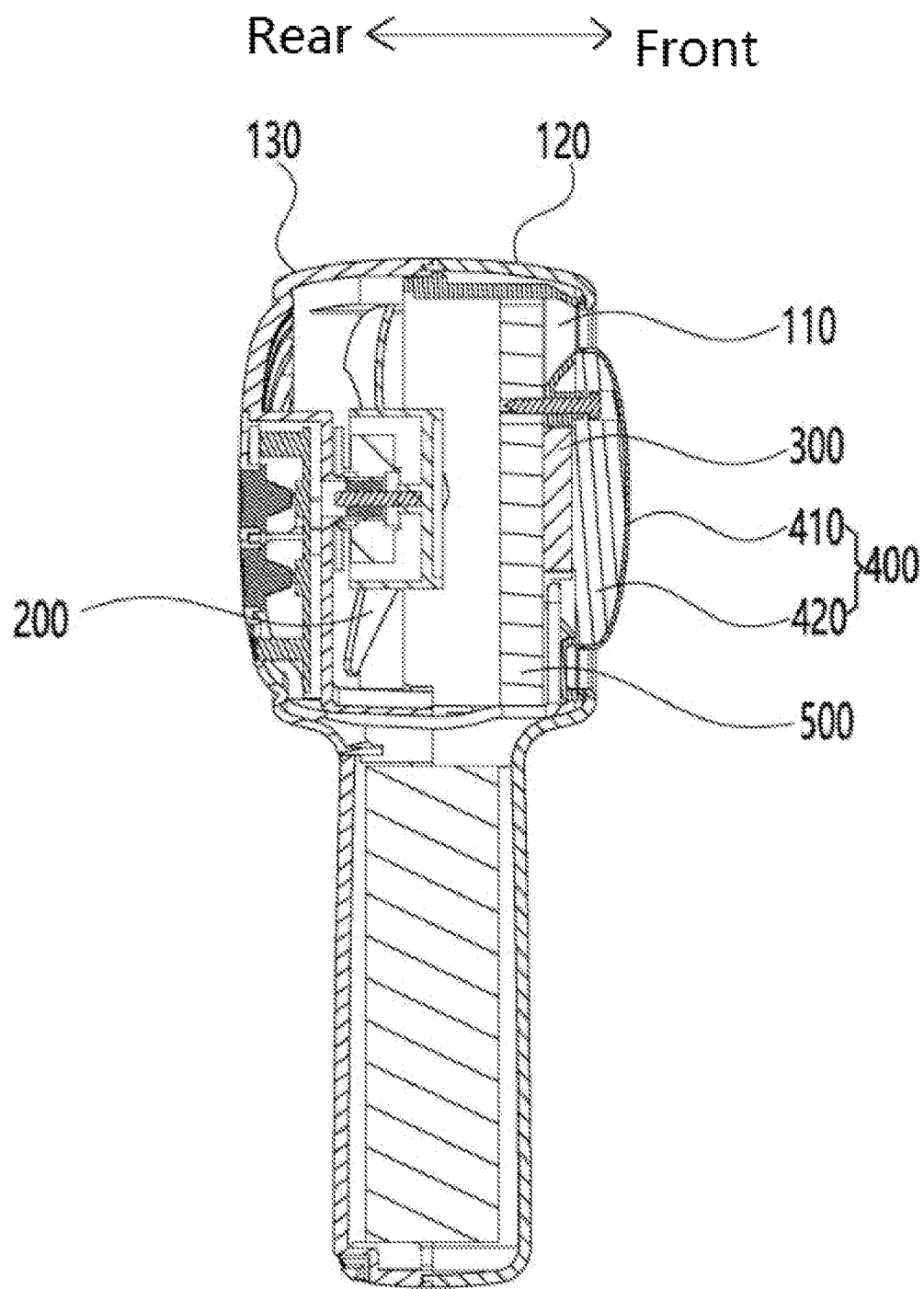
FIG. 2 is a left side cross-sectional schematic diagram of the handheld fan according to one embodiment of the present disclosure.

As shown in FIGS. 1 and 2, the present disclosure provides a handheld fan. The handheld fan comprises a housing 100. A cold conducting piece 400, a semiconductor chilling plate 300, and a fan assembly 200 are arranged in sequence in the housing 100 from front to back. The cold conducting piece 400 is arranged on a front end surface of the housing 100. A front end surface of the semiconductor chilling plate is a cooling surface. The cooling surface of the semiconductor chilling plate 300 is attached to a rear side of the cold conducting piece 400. The cold conducting piece 400 does not cover an entire front end surface of the housing 100, Therefore, an air outlet 110 is defined between the cold conducting piece 400 and the housing 100.

When in use, the fan assembly 200 is activated to blow air forward, and the air is blown out from the air outlet 110. At the same time, the semiconductor chilling plate 300 is activated to cool the cold conducting piece 400. When in use, a user is able to directly attach a front end surface of the cold conducting piece 400 to the skin, and cooperate with airflow generated by the fan assembly 200 to perform direct double cooling on a human body to obtain a good cooling effect.

In some embodiments of the present disclosure, the cold conducting piece 400 comprises a metal temperature-conducting cover 410 and a metal temperature-conducting block 420. A rear end surface of the metal temperature-conducting block 420 is attached to the cooling surface of the semiconductor chilling plate 300. An area of the rear end surface of the metal temperature-conducting block 420 is greater than an area of the front end surface of the semiconductor chilling plate 300. The metal temperature-conducting cover 410 is covered on a front end surface of the metal temperature-conducting block 420. The temperature is conducted between the semiconductor chilling plate 300 and the metal temperature-conducting cover 410 through the metal temperature-conducting block 420. The metal heat conducting block 420 is configured to increase a cooling area and improve the cooling effect.

In some embodiments of the present disclosure, as shown in FIG. 2, the front end surface of the metal temperature-conducting cover 410 is an arc surface protruding forward, which increases a contact area between the metal temperature-conducting cover 410 and the human skin.

In some embodiments of the present disclosure, the handheld fan further comprises a heat dissipating net 500. The heat dissipating net 500 is arranged between the semiconductor chilling plate 300 and the fan assembly 200. The heat dissipating net 500 is attached to a rear end surface of the semiconductor chilling plate 300. The front end surface of the semiconductor chilling plate 300 is the cooling surface, and a rear end surface of the semiconductor chilling plate 300 is a heat dissipating surface. The heat dissipating net 500 is configured to increase a heat dissipating area of the semiconductor chilling plate 300 and dissipate of semiconductor chilling plate 300. Meanwhile, the airflow generated by the fan assembly 200 passes through the heat dissipating net 500 to dissipate the heat, which improves heat dissipating effect while avoids a problem that blown air becomes hot due to accumulation of heat.

In some embodiments of the present disclosure, the heat dissipating net 500 is arranged' behind the air outlet 110. As shown in FIG. 2, when the heat dissipating net 500 dissipates heat of the semiconductor chilling plate 300, it further prevents user's fingers or other objects from reaching into the housing 100 from the air outlet 110, so the fan assembly 200 is not touched.

Figure 3:
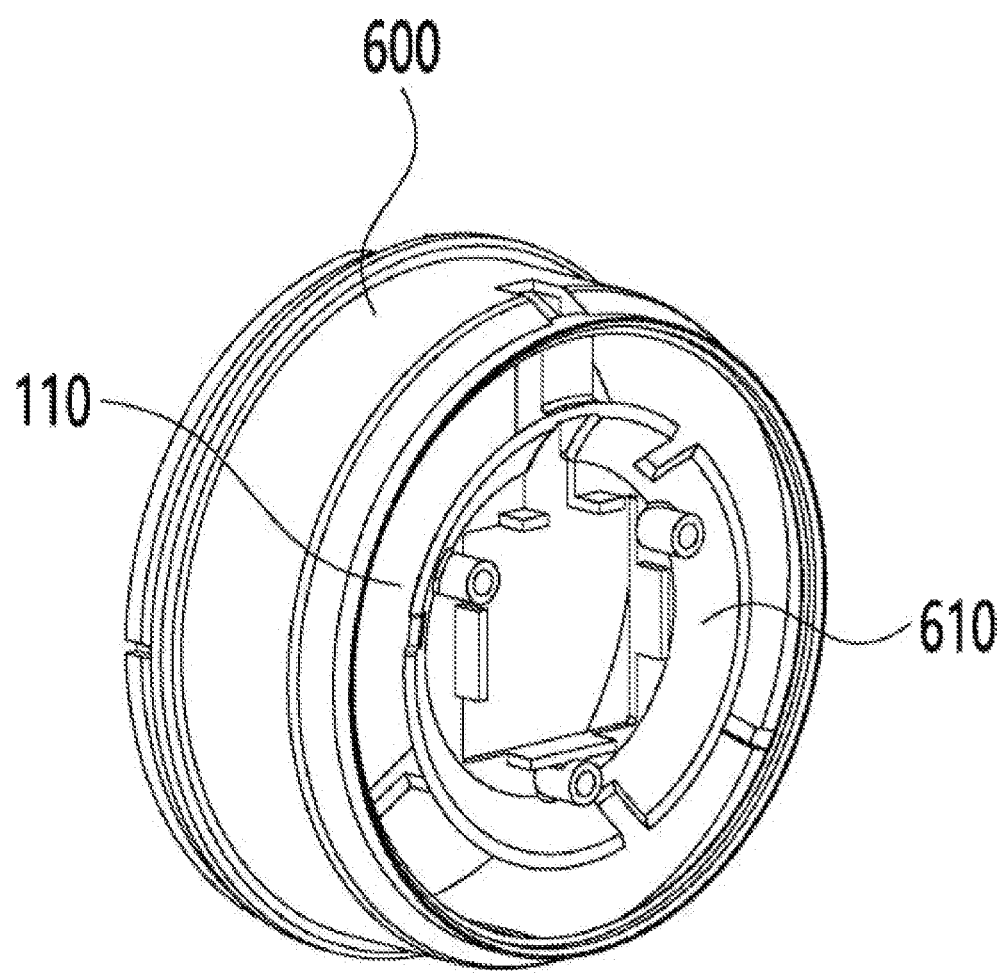
FIG. 3 is a schematic diagram of an air duct according to one embodiment of the present disclosure.

In some embodiments of the present disclosure, as shown in FIGS. 2 and 3, an air duct 600 is arranged on a front portion in the housing 100. A shape of an outer contour of the air duct 600 is matched with a shape of an inner wall of the housing 100. A mounting portion 610 is arranged in a middle portion of the air duct 600. The mounting portion 610 is hollow. A front portion of the mounting portion 610 is configured to fix the semiconductor chilling plate 300 and the cold conducting piece 400. A gap is defined between the mounting portion 610 and a side wall of the air duct 600 to form the air outlet 110. As shown in FIG. 3, the air duct 600 is in a shape of a hollow cylinder, and the semiconductor chilling plate 300 and the cooling conducting 400 are fixed to the front portion of the mounting portion 610 by means of screws, clips, or the like, which are not limited thereto.

The heat dissipating net 500 is mounted on a rear portion of the mounting portion 610 and is attached to the rear end surface of the semiconductor chilling plate 300 through a hollow portion of the mounting portion 610.

In some embodiments of the present disclosure, the mounting portion 610 is in the shape of a bowl with a first opening and a second opening separately on two ends of the mounting portion 610. The first opening is greater than the second opening. The first opening faces forward. As shown in FIG. 2 and FIG. 3, an outer wall of the mounting portion 610 is arc-shaped, and the mounting portion 610 cooperates with an inner wall of the air duct 600 to effectively divert the airflow along a direction of the air outlet 110.

In some embodiments of the present disclosure, the housing 100 comprises a front shell 110 and a rear shell 120. The fan assembly 200, the semiconductor chilling plate 300, and the cold conducting piece 400 are fixed on the rear shell 120. Since electrical components such as the fan assembly 200, the semiconductor chilling plate 300, and the cold conducting piece 400 need to be connected with wires, all these electrical components are fixedly mounted on the rear shell 130. The front shell 120 is directly covered on the rear shell 130 to complete assembly of the handheld fan, which is very convenient for installation.

In descriptions of the specification, description with reference to the terms "some specific embodiments" and the like means that specific features, structures, materials, or characteristics described in connection with the embodiments or examples is included in at least one embodiment or example of the present disclosure. In the specification, schematic representations of the above terms are not necessarily directed to the same embodiment or example. Furthermore, the particular features, structures, materials, or characteristics described may be combined in any suitable manner in any one or more embodiments or examples.

Although embodiments of the present disclosure have been shown and described, it is understood by those skilled in the art that various changes, modifications, substitutions, and alterations can be made according to these embodiments without departing from the principles and spirit of the present disclosure. The scope of the present disclosure is defined by the claims and their equivalents.

What is claimed is:

1. A handheld fan, comprising:
    a housing;
    a fan assembly mounted in the housing and close to a rear portion of the housing;
    a semiconductor chilling plate mounted in the housing and arranged in front of the fan assembly; and
    a cold conducting piece arranged on a front end of the housing;
    wherein a front end surface of the semiconductor chilling plate is a cooling surface; the cold conducting piece is attached to the front end surface of the semiconductor chilling plate; an air outlet is defined between the cold conducting piece and the housing;
    wherein an air duct is arranged on a front portion in the housing; and
    a mounting portion is arranged in a middle portion of the air duct the mounting portion is in a shape of a bowl with a first opening and a second opening separately on two ends of the mounting portion, the first opening is greater than the second opening; the first opening faces forward.

2. The handheld fan according to claim 1, wherein the cold conducting piece comprises a metal temperature-conducting cover and a metal temperature-conducting block; a rear end surface of the metal temperature-conducting block is attached to the cooling surface of the semiconductor chilling plate; an area of the rear end surface of the metal temperature-conducting block is greater than an area of the front end surface of the semiconductor chilling plate; the metal temperature-conducting cover is covered on a front end surface of the metal temperature-conducting block.

3. The handheld fan according to claim 2, wherein the front end surface of the metal temperature-conducting cover is an arc surface protruding forward.

4. The handheld fan according to claim 3, wherein the housing comprises a front shell and a rear shell; the fan assembly, the semiconductor chilling plate, and the cold conducting piece are fixed on the rear shell.

5. The handheld fan according to claim 2, wherein the housing comprises a front shell and a rear shell; the fan assembly, the semiconductor chilling plate, and the cold conducting piece are fixed on the rear shell.

6. The handheld fan according to claim 1, wherein the handheld fan further comprises a heat dissipating net, the heat dissipating net is arranged between the semiconductor chilling plate and the fan assembly; the heat dissipating net is attached to a rear end surface of the semiconductor chilling plate.

7. The handheld fan according to claim 6, wherein the heat dissipating net is arranged behind the air outlet.

8. The handheld fan according to claim 7, wherein the housing comprises a front shell and a rear shell; the fan assembly, the semiconductor chilling plate, and the cold conducting piece are fixed on the rear shell.

9. The handheld fan according to claim 6, wherein the housing comprises a front shell and a rear shell; the fan assembly, the semiconductor chilling plate, and the cold conducting piece are fixed on the rear shell.

10. The handheld fan according to claim 1, wherein a shape of an outer contour of the air duct is matched with a shape of an inner wall of the housing; the mounting portion is hollow; a front portion of the mounting portion is configured to fix the semiconductor chilling plate and the cold conducting piece; a gap is defined between a side wall of the mounting portion and a side wall of the air duct to form the air outlet.

11. The handheld fan according to claim 1, wherein the housing comprises a front shell and a rear shell; the fan assembly, the semiconductor chilling plate, and the cold conducting piece are fixed on the rear shell.

* * * * *